(12) United States Patent　　(10) Patent No.: US 8,791,416 B2
Shiue et al.　　(45) Date of Patent: Jul. 29, 2014

(54) ON-CHIP THIN FILM ZERNIKE PHASE PLATE AND APPLICATIONS THEREOF

(71) Applicant: Academia Sinica, Taipei (TW)

(72) Inventors: Yunn-Shin Shiue, Taipei (TW); Pai-Chia Kuo, Taipei (TW); Chih-Ting Chen, Taipei (TW); Yuh-Lin Wang, Taipei (TW); Yong-Fen Hsieh, Hsinchu (TW)

(73) Assignee: Academia Sinica, Taipei (TW)

( * ) Notice: Subject to any disclaimer, the term of this patent is extended or adjusted under 35 U.S.C. 154(b) by 0 days.

(21) Appl. No.: 14/107,162

(22) Filed: Dec. 16, 2013

(65) Prior Publication Data

US 2014/0166880 A1　Jun. 19, 2014

Related U.S. Application Data

(60) Provisional application No. 61/738,634, filed on Dec. 18, 2012.

(51) Int. Cl.
*H01J 37/26*　(2006.01)
*H01J 37/04*　(2006.01)
*G01N 23/02*　(2006.01)
*G21K 1/08*　(2006.01)

(52) U.S. Cl.
CPC .............. *H01J 37/26* (2013.01); *Y10S 977/881* (2013.01)
USPC ........ 250/311; 250/310; 250/306; 250/505.1; 977/881

(58) Field of Classification Search
USPC ................ 250/311, 310, 306, 505.1; 977/881
See application file for complete search history.

(56) References Cited

U.S. PATENT DOCUMENTS

| | | | |
|---|---|---|---|
| 7,915,584 B2 * | 3/2011 | Tiemeijer et al. ............. | 250/310 |
| 2003/0066964 A1 * | 4/2003 | Nagayama et al. ........... | 250/311 |
| 2012/0037815 A1 * | 2/2012 | Shiue et al. ............. | 250/441.11 |
| 2013/0193322 A1 * | 8/2013 | Blackburn .................... | 250/311 |
| 2013/0313428 A1 * | 11/2013 | Buijsse ........................ | 250/307 |

* cited by examiner

*Primary Examiner* — Nikita Wells
(74) *Attorney, Agent, or Firm* — Bacon & Thomas, PLLC (57) ABSTRACT

The present invention provides an on-chip thin film phase plate for a releasing charging, comprising a chip substrate having one or more apertures; and a thin film layer attached to the top surface of the chip substrate. The present invention also provides a method for observing organic material by TEM, which uses the above-mentioned on-chip thin film phase plate in a TEM system.

15 Claims, 10 Drawing Sheets

**Design of a on-chip thin film phase plate
(top view)**

b

**On-chip Zernike thin film phase plate
(cross-sectional view)**

**Design of a on-chip thin film phase plate
(top view)**

b

**On-chip Zernike thin film phase plate
(cross-sectional view)**

ON-CHIP THIN FILM ZERNIKE PHASE PLATE AND APPLICATIONS THEREOF

BACKGROUND OF THE INVENTION

1. Field of the Invention

The present invention relates to an on-chip thin film Zernike phase plate for releasing charging, and applications thereof.

2. Description of the Related Art

Organic devices, such as polymer solar cells and organic light-emitted diodes (OLED), have attracted considerable attention in recent years. The efficiencies of these organic devices greatly depend on their nanoscale structures. For example, the nanoscale morphology affects the charge transport in the donor/acceptor blend, and hence influences the power conversion efficiency of a bulk heterojunction polymer solar cell.[1-5] Characterizing nano-structures in organic devices thus has a critical importance in optimizing their performance. Transmission electron microscopy (TEM) has long been used for characterizing nano/micro-structures in materials, while its application on organic materials has been limited because the contrast of TEM images for organic specimens is usually poor since they are constituted with light elements, i.e. C, O, and N. The defocus technique is well known for enhancing contrast of TEM images, while it is a tricky technique for not only does it result in a significant loss of resolution, but it also causes some artifacts, consequently complicating the interpretation of the images. In-focus TEM imaging for organic materials with enhanced contrast is therefore a much needed technique, particularly with the rapidly growing interest in organic devices.

Adopting a phase plate in the optical path of a TEM to enhance the contrast of the in-focus image was proposed 60 years ago.[6,7] Various TEM phase plates have been in development for decades,[8-16] and some promising results using thin film Zernike phase plates have been presented.[17,18] Using a thin film phase plate inevitably scarifies some high resolution signals, due to the loss of coherence resulting from the interaction between the scattered wave and the carbon film. Such a drawback, however, does not preclude its major advantage in characterizing nano-structures of organic materials which are too vague under conventional TEM. Although Zernike phase plates have been successfully used to reveal the structure of ice-embedded biomolecules,[18] a more reliable phase plate technique that allows phase contrast images to be taken reliably and repeatedly is still in need, since the performance of TEM phase plates deteriorates too quickly.[7,13,16] One of the major causes for the unstable performance of a TEM phase plate is the charging effect.[13,16] When a physical phase plate is present in the pathway of the electron beam, the build up of charged particles in some local sites would result in instability and distortion of the image formed. Such a notorious charging effect resulting from phase plates has been known for some time, and is still considered an obstacle for TEM phase plate technology to be put into routine use until very recently.[13,16] Practically, the investigation of nanostructures of organic materials with phase plates can hardly be realized without a reliable and routinely achievable method for taking in-focus phase TEM images.

SUMMARY OF THE INVENTION

The present invention provides an on-chip thin film Zernike phase plate system, operated on a commercial TEM, which can effectively release the charging resulted from the phase plate, provide a steady performance, and realize the in-focus TEM phase imaging by routine operation of the TEM phase plates of the present invention. In the present invention, a chip fabricated and cut out from a wafer is combined with the conventional Zernike carbon phase plate, so the charging accumulated in the phase plate can be effectively released. Therefore, the phase plate of the present invention has a prolonged life and can be routinely used. Such a reliable system allows us to recognize and verify an unexpected nanophase in polymer solar cell samples of in-device thickness. Moreover, we are able to observe fine structures of bio-specimens without staining using this stable TEM phase imaging technique.

One object of the present invention is to provide an on-chip thin film Zernike phase plate system, which is capable of observing fine structures of organic materials, including polymer samples and unstained bio-specimens. And, the on-chip thin film Zernike phase plate of the present invention can be repeatedly used.

Another object of the present invention is to provide a method for observing fine structures of organic materials with a TEM system.

To achieve these objects, the present invention provides an on-chip thin film phase plate for releasing charging, comprising:
- a chip substrate having one or more apertures;
- a thin film layer attached to the top surface of the chip substrate, wherein the thin film layer comprises one or more phase plate holes aligned with the apertures, and the phase plate holes have a diameter smaller than that of the apertures.

In a preferred embodiment, the chip substrate is fabricated from a wafer. Specifically, the chip substrate is fabricated from a wafer by photolithography, ICP (Inductively Coupled Plasma) etching, and KOH (potassium hydroxide) etching. More preferably, the wafer is a Si wafer; even more preferably, the wafer is coated with one or more dielectric films; and most preferably, the one or more dielectric films are selected from $Si_3N_4$, $SiO_2$ or $Al_2O_3$.

In a preferred embodiment, the chip substrate has a roughness of 0.2-3 nm; more preferably, 0.5-1 nm.

In a preferred embodiment, the thin film layer is composed of the material selected from carbon (C), beryllium (Be), gold (Au), silver (Ag), silicon (Si), aluminum (Al), or tungsten (W); more preferably, the thin film layer is composed of carbon (C).

In a preferred embodiment, the thin film layer has a thickness of 10-100 nm; more preferably, 25-35 mm.

In a preferred embodiment, the apertures have a diameter of 5-500 µm; more preferably, 100 µm.

In a preferred embodiment, the phase plate holes has a diameter of less than 2 µm; more preferably, 500 nm-1 µm.

In a preferred embodiment, the on-chip thin film phase plate further comprises a conductive layer coated on surfaces of the chip substrate; more preferably, the surfaces of the chip substrate comprise the top surface and the bottom surface of the chip substrate, and the inner wall surfaces of the one or more apertures. In other words, the chip substrate is preferably "wrapped" by the conductive layer or covered by the conductive layer in a 3-dimensional (3D) manner.

In a preferred embodiment, the conductive layer is composed of the material selected from gold (Au), platinum (Pt), copper (Cu), or alloys thereof; more preferably, the conductive layer is composed of gold (Au). The conductive layer and the film layer can be composed of the same material, but it is preferred that they are composed of different materials.

In a preferred embodiment, the conductive layer has a thickness of 10-500 nm, more preferably, 100-150 nm.

The present invention also provides a method for observing organic material by a transmission electron microscope, comprising:
(a) providing an organic material specimen;
(b) locating the above-mentioned on-chip thin film phase plate in a transmission electron microscope; and
(c) observing the organic material specimen.

In a preferred embodiment, the above-mentioned on-chip thin film phase plate is located at a back focal plane.

In a preferred embodiment, the organic material is a polymer or a bio-specimen; more preferably, the bio-specimen is an unstained bio-specimen.

The present invention provides a TEM system comprising an on-chip thin film phase plate, which can effectively release charging resulted from the electron beam bombardment. Therefore, it has a prolonged life and can be routinely used in any TEM system for observing organic materials, especially for polymer and bio-specimens.

BRIEF DESCRIPTION OF THE DRAWINGS

FIGS. 5(c) and 5(d) represent the FFT images of FIGS. 5(a) and 5(b), respectively.

FIGS. 6(c) and 6(d) represent the enlarged FFT images of FIGS. 6(a) and 6(b), respectively.

FIGS. 7(d), 7(e) and 7(f) represent the enlarged FFT images of FIGS. 7(a), 7(b) and 7(c), respectively.

FIGS. 8(c) and 8(d) represent the FFT images of FIGS. 8(a) and 8(b), respectively. A two-color coding scheme was applied on (a) and (b) and resulted in the images shown in FIGS. 8(e) and 8(f), respectively. Insets: histograms of the main images with the corresponding color scales. Scale bar: 500 nm.

DETAILED DESCRIPTION OF THE PREFERRED EMBODIMENTS

Transmission electron microscopy (TEM) is a powerful tool in imaging nanostructures, yet its capability is limited with respect to the imaging of organic materials because of the intrinsic low contrast problem. TEM phase plates have been developed for decades, yet a reliable phase plate technique has not been available because the performance of TEM phase plates deteriorates quickly. Such an obstacle prohibits in-focus FEM phase imaging to be routinely achievable, thus limits the technique being used in practical applications. Here we present an on-chip thin film Zernike phase plate which can effectively release charging, and allow reliable in-focus TEM images of organic materials with enhanced contrast to be routinely obtained. With this stable system, we are able to characterize many polymer solar cell specimens, and consequently identify and verify the existence of an unexpected nanoparticle-phase. Furthermore, we are also able to observe the fine structures of an E. coli specimen, without staining, by using the on-chip thin film phase plate of the present invention. Our system, which can be installed on a commercial TEM, opens up exciting possibilities for TEM to characterize organic materials.

Figure 1:
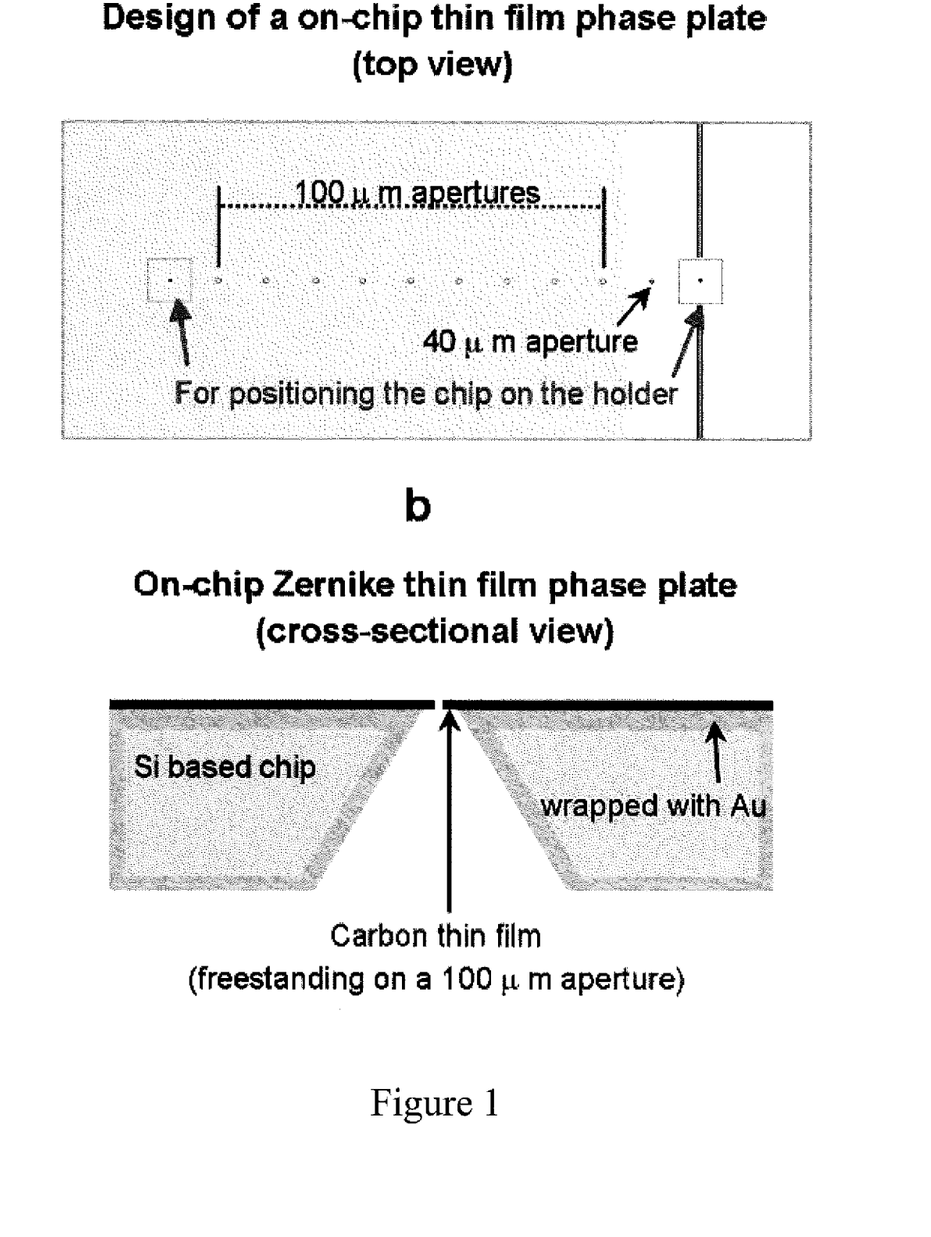
FIG. 1 illustrates the design of the on-chip thin film Zernike phase plate system of the present invention, including (a) top view and (b) cross-sectional view of the on-chip Zernike thin film phase plate.

Design and Preparation of the on-Chip Thin Film Zernike Phase Plate of the Present Invention The on-chip thin film phase plate of the present invention is shown schematically in FIG. 1 with a top view (a), and a cross-sectional view (b). In the following examples, the on-chip thin film phase plate of the present invention comprises a 14 mm×6 mm Si-based chip substrate having multiple apertures, a gold conductive layer "wrapping" the substrate, and an amorphous carbon film layer having milled phase plate holes aligned to the apertures and partly covered the correspondingly apertures of the substrate. The dimensions of the chip are not specifically limited. The number and arrangement of the phase plate holes of the present invention are not specifically limited. In the following examples, there are nine phase plate holes arranged in one single line on the on-chip thin film phase plate of the present invention because it is easy to operate. On this Si-based chip substrate, nine apertures of 100 µm in diameter are covered with the amorphous carbon thin film (the light gray area) with milled holes and serve as phase plate holes. And, there is one aperture of 40 µm in diameter not covered with the amorphous carbon thin film, and serves as an objective aperture. Those skilled in the art can easily change the dimensions and the arrangement of the apertures on the chip substrate, as well as the carbon film coverage area for suiting specific needs.

The Si-based chip substrate was fabricated starting with a Si wafer with a top and a bottom layer of $Si_3N_4$ (250 nm in thickness), which went through photolithography, ICP (Inductively Coupled Plasma) etching, and KOH etching procedures for producing the desired chip shape. The apertures on the chips were fabricated during photolithography and etching processing. After that, thermal evaporation was used to coat the chips with Au (100-150 nm in thickness). The chips were then cut out from the wafer to be used as chip substrates for thin film phase plates.

All types of wafers can be used to fabricate the chip substrates of the present invention. If Si wafer is used, the crystal structure of Si would result in square-shaped holes during KOH etching process, therefore Si wafer coated with dielectric films are preferably used for fabricating chips with round shaped apertures. Many dielectric films can be used during the photolithography process of making the chip substrates of the present invention, such like $Si_3N_4$, $SiO_2$ or $Al_2O_3$.

In the following examples, as shown in FIG. 1, there are nine phase plate holes on the phase plate of the present invention. Basically, one phase plate hole is sufficient for operating the phase plate of the present invention, but we made more for spare use. And, there is an empty objective aperture on this chip, which is not a necessary design for the on-chip phase plate of the present invention. But it is convenient to keep the objective aperture on the same phase plate chip of the present invention because the phase plate hole and objective aperture can be switched quickly during TEM operation if needed.

In addition, there is a thin line (gold) on right side of the phase plate, which is used for conveniently identifying the chip orientation. The thin gold line design is not necessarily needed for the present invention.

In the conventional TEM thin film phase plates, metal sheets with a drilled hole, metal grids, or metal apertures might be used as phase plate substrates. However, the surface of these conventional metal substrates is rough, and this results in inefficiency of charging releasing, thereby distorting the TEM images. In the present invention, a silicon-based chip substrate having a flat surface (the average surface roughness of a commonly used Si wafer is 0.5-1 nm) is used, and the on-chip thin film phase plate of the present invention is much more efficient in releasing charging than the conventional on-grid thin film phase plate,[7] in which the thin film is attached to a metal piece with multiple micron sized holes (i.e. phase plate grid). Since the surface of such a metal grid is not microscopically flat and a surface oxide layer is formed on the grid, the release of charging from the carbon film attached thereon is less effective. In the present invention, there is a large contacting area between the Au-coated chip substrate and the carbon thin film. This provides an effective charge release area. Using silicon-based chips as the phase plate substrate also has the advantages of low fabrication cost and precise dimensions. The precise dimensions result in accurate alignment of the phase plates on the plate holder, and this is important for data reproducibility for routine use.

The Si-based chip substrate is covered by Au in a 3-dimensional (3D) manner, rather than simply coated with Au on the top surface. The high conductivity and inert nature of Au are desirable for charge release, and the 3D wrapping manner avoids charging caused by electrons coming from all directions. These electrons, including scattered and secondary electrons, could build up local fields on any sites along the electrons passing path, thus a simple top conducting layer is insufficient to release the charges.

An amorphous carbon film (25-35 nm in thickness) was fabricated by depositing a thin carbon film using a carbon coater (Q150T, Quorum Technologies) onto a freshly cleaved mica (MUSCOVITE MICA V-5, Electron Microscopy Sciences) sheet, based on the commonly used amorphous carbon thin film preparation technique.[19] The on-mica amorphous carbon film was floated on a deionized (D. I.) water surface, then transferred to the surface of the Au-coated chip substrate, by simply using the chip to pick up the carbon film. The on-chip thin film was then dried overnight in an electrical dry box with humidity of ~50% R.H. The whole process of transferring the carbon film onto the chip surface was carried out in a class 1000 (ISO 14644) cleanroom to avoid contaminations.

Figure 2:
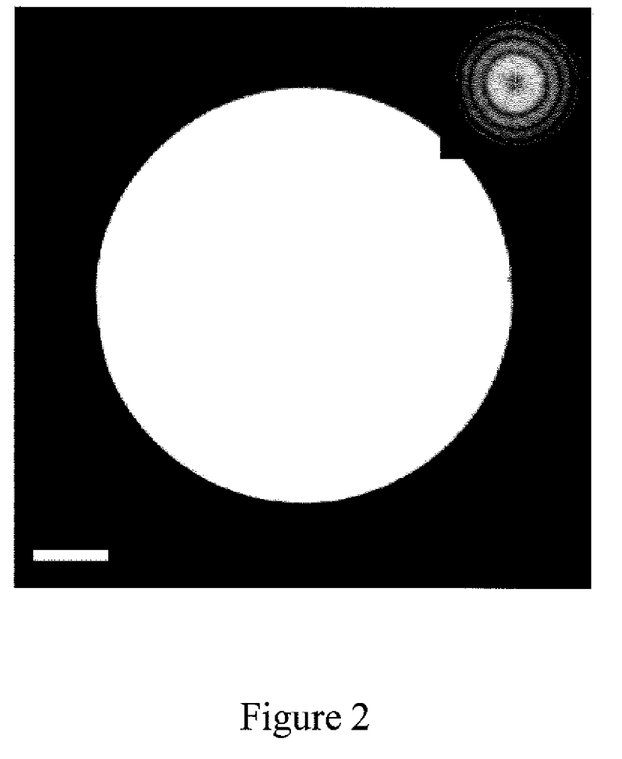
FIG. 2 represents TEM image of an on-chip carbon film, and the inset shows the Fast Fourier transform (FFT) image of the corresponding TEM image. Scale bar: 20 µm.

The carbon film firmly sticks to the chip surface after drying, and no special care was needed during TEM operation. The on-chip carbon film should be uniform and clean without any dust or contamination. The TEM and FFT (Fast Fourier Transform) images of the on-chip carbon film show that the carbon film is uniform (see FIG. 2). The FFT image was transformed from the TEM image obtained by a commercial TEM (JEOL JEM-2100) using the imaging software associated with the TEM system, which can be used to identify the uniformity of a carbon film. Defocus imaging condition was applied in the example shown in FIG. 2 in order to observe more FFT rings. The FFT rings are round and have no distortion indicating the carbon film quality is good and uniform.

The phase-plate holes (500 nm-1 μm in diameter) were then milled on the carbon film using a 30 kV Ga $^+$ focused ion beam (FIB) system (Nova 600, FEI). A carbon thin film having phase plate holes with correct size and shape gives a steady performance. The detail FIB milling procedures of milling such a hole are provided below.

Firstly, a milling trial run can be performed to adjust all parameters: (1) switching the system to ion beam imaging function and aligning the ion beam, in which the current condition for imaging and for milling are the same (in the examples, 50 pA); (2) milling a hole with the desired size (in the examples, 1 μm) for a fixed time (in the examples, <1s), then switching the system to electron beam imaging function to observe the size and the shape of the hole. If the hole shape is wrong, one should go back to the first step to adjust the beam alignment again; if the hole size is wrong, one should go back to fine tune the milling time.

Once all these beam parameters were tuned correctly, the chip covered with a carbon thin film was moved to the target position, and quickly scanned with a low magnification imaging using the scanning electron microscope (SEM) equipped on the FIB system, to locate the position of apertures of the substrate and mill the phase plate holes. Switching between SEM imaging and ion beam functions may result in a slight offset (<5 μm) from the exact central-point of the 100 μm aperture. Such an offset has no noticeable effect on the performance of the thin film phase plate. The beam current should be small enough so it does not damage the thin film severely. Using an unnecessary long milling time should be avoided. The ion beam tail would keep bombard the carbon film, resulting in wrong size of the phase plate hole and uneven film around the edge of the hole.

The thickness of the carbon film was measured by an ellipseometer (Ubest V-570, JASCO) and verified by an alpha stepper (Dektak150, Veeco). On-chip thin film phase plates with various film thicknesses can be fabricated, but the accuracy of the film thickness is not critical in phase shifting. In the following examples, the thin film phase plate has a thickness of 34 nm, which corresponds to ~−0.58 π phase shift at 200 kV. The phase-plate hole used in the present invention has a diameter of 1 μm, while the exact diameter of the phase plate hole is not critical for the present invention.

Operation of TEM System

The transmission electron microscopy (TEM) used in the following examples is a TEM (JEOL JEM-2100) equipped with a $LaB_6$ source. The model of the TEM system is not specifically limited. The present invention is adoptable in any commercial TEM with any electron source. In this TEM system, the spherical aberration coefficient ($C_S$) is 3.3 mm, the chromatic aberration coefficient ($C_C$) is 3 mm, and the focal length is 3.9 mm. The cut-on frequency determined by the accelerating voltage, the focal length, and the radius of the phase plate hole in the examples is ~0.05 $nm^{-1}$.

In the following examples, normal TEM imaging operation with the usual illumination condition was adopted with or without the phase plate. The on-chip thin film phase plate of the present invention can be installed on any TEM system and operated under any condition. In the following examples, all the FEM images were taken under the condition that the TEM was operated at 200 kV, and all the phase-plate assisted images (phase images) were taken by using the phase plate with a 1 μm phase plate hole.

After the beam was aligned following the usual TEM beam alignment procedure, the phase plate chip was loaded into the TEM using a conventional loading set,[24] and the selected aperture on the phase plate was located on the beam path. The phase plate hole could be seen on the fluorescent screen, and it was positioned at the centre of the screen using the x-axial and y-axial piezo motors attached on the phase plate loading set. The z-height of the phase plate was then adjusted using the z-axial piezo motor until the phase plate was positioned at the correct focal plane height. The on-screen image of the phase-plate hole will shrink or expand when the phase plate leaves or approaches the focal plane. It is a criterion for determining whether the phase plate is at the focal plane height. The whole process of positioning the phase plate can be completed within five minutes. The change in contrast transfer function (CTF) resulted from the on-chip Zernike thin film phase plate of the present invention is similar to those reported for thin film style Zernike phase plates in prior art[20,21].

Figure 3:
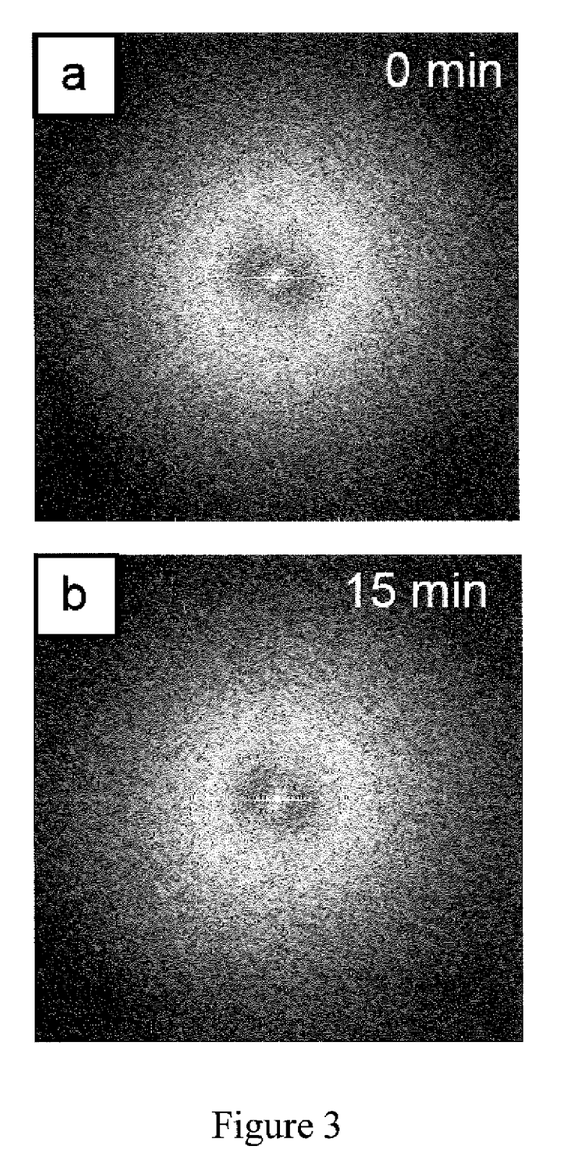
FIG. 3 represents FFT images of an amorphous carbon film, which are taken with the phase plate of the present invention in position (a) at the beginning of the imaging test and (b) after the phase plate was used for imaging for 15 min.

Conventionally, when the high-energy electron beam repeatedly passes through the phase plate hole located on the phase plate (ex. a carbon plate), the charging caused by the electron beam will accumulate in the phase plate, also the organic contaminants (ex. carbon) may deposit around the phase plate hole resulting in more charging. These charging effect are shown in FFT image by changes and distortion of FFT images. In the present invention, the phase plate performance is reasonably stable once it is correctly positioned. To demonstrate the stability of the on-chip thin film phase plate of the present invention, the FFT images of an amorphous carbon film specimen with the phase plate of the present invention in position at the beginning of imaging (FIG. 3(a)) and after the phase plate was continually used for 15 minutes (FIG. 3(b)) are used for comparison. It can be seen in FIG. 3 that the FFT image is stable proving the stability of the on-chip phase plate.

Figure 4:
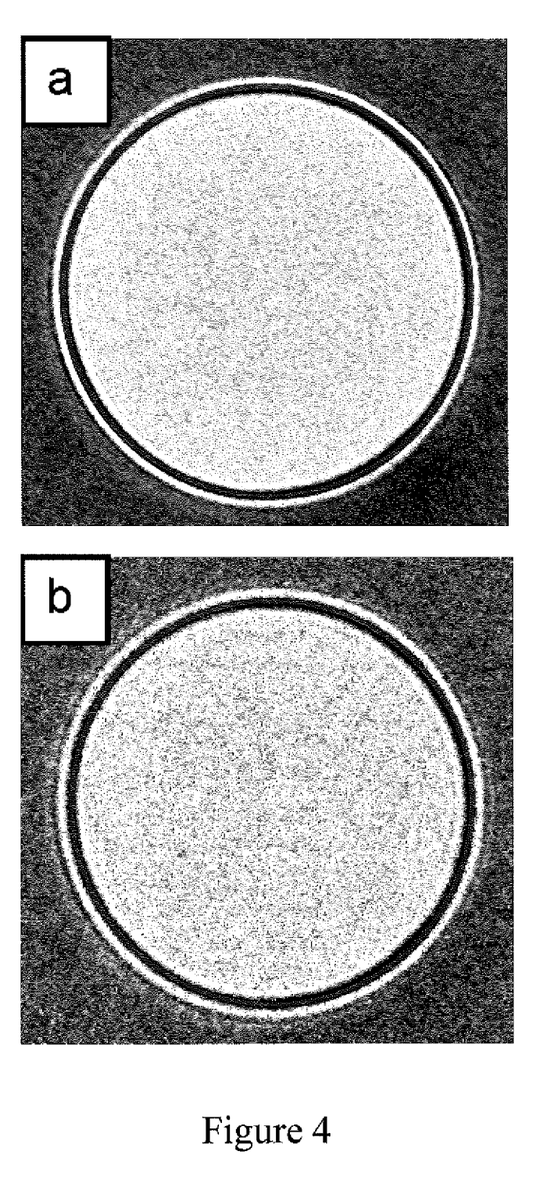
FIG. 4 represents the TEM images of the 1 µm phase plate hole on the on-chip phase plate of the present invention (a) before testing and (b) after the phase plate was used for two days, which were taken without any TEM specimen in the beam path. The red circle is a reference mark for indicating the round shape of the phase plate hole.

The durability of the phase plate hole of the present invention was also tested. The phase plate of the present invention was continually irradiated by e-beam for at least 6 hours/day for two days. During this test, the phase plate was intentionally positioned at the incorrect focal height, thus the artificial edge around the hole was clearly seen for the purpose of observing the hole shape. And, the test was conducted without any TEM specimen presented, so the e-beam went directly through the phase plate intensively. After the test, the phase plate hole shape remained round and symmetric without visible defects (see FIGS. 4 (a) and (b)). The red circle shown in FIGS. 4(a) and 4(b) is a reference mark for indicating the round shape of the phase plate hole, again proving the durability of the present invention.

Preparation of Organic Material Samples for TEM Observation (1) TEM Specimens of P3HT/PCBM Photoactive Layers Retrieved from Polymer Solar Cells A thin layer of Poly(3,4-ethylenedioxythiophene):Poly (styrenesulfonate) (PEDOT:PSS) (H.C. Starck, Baytron P 4083) with a thickness of 30 nm was spun-cast onto an indium tin oxide (ITO) substrate. After baking the PEDOT:PSS film at 120 °C. for one hour, the device was moved into a nitrogen-purged glove box for subsequent deposition. A photoactive layer of P3HT/PCBM (poly(3-hexylthiophene)/[6,6]-phenyl-C61-butyric acid ethyl ester, weight ratio 1:1) was deposited onto the PEDOT:PSS layer by spin-coating a P3HT/PCBM blend mixed in a solvent. Two solvents could be used for preparing the P3HT/PCBM blend: 1,2,4-trichlorobenzene (TCB) and chloroform ($CHCl_3$). The thickness of the P3HT/PCBM layer, after spin coating and drying, is 160±10 nm, as measured using an alpha stepper. The specimen of P3HT/PCBM for TEM imaging was then prepared by dissolving the PEDOT:PSS layer in D.I. water, and floating the P3HT/PCBM thin film on the water surface. The P3HT/PCBM thin film was immediately picked up by a TEM grid made of Cu and dried in a desiccator before TEM observation.

(2) Preparation of Unstained *E. Coli* Specimen for TEM Imaging

*E. coli* (BCRC No. 11458, (Migula) Castellani and Chalmers) was obtained from Bioresource Collection and Research Center (BCRC), Taiwan. After being cultured on a blood agar plate for 16 hours, a small amount of growth (approximately one colony) of *E. coli* was picked up and mixed with 1 ml of distilled water to create an *E. coli* suspension. The TEM specimen of unstained *E. coil* was prepared by putting a small drop (~2 μl) of *E. coli* suspension on a TEM grid (carbon film type), and air-drying for several hours until the suspension is dried.

The examples of the present invention are provided hereinafter, however, these examples are not used for limit the scope of the present invention. The amendments and modifications can be made by those skilled in the art without departing the spirit and scope of the present invention.

EXAMPLES

Example 1

TEM Image Drifting of the Phase Plates with and without Complete Conductive Layer Coating A standard TEM specimen with Au nanoparticles (particle size <5 nm) was used to study the drifting pattern of TEM imaging. The standard specimen of Au was used to avoid the image drifting caused by the sample charging itself. It was found that when the phase plate chip was not loaded, the TEM image drifted towards the same direction with a drifting rate of ~2 nm/min, and this is the mechanical drifting of the TEM system itself. Such a drifting rate is within the acceptable mechanical drifting range of the TEM system.

Figure 5:
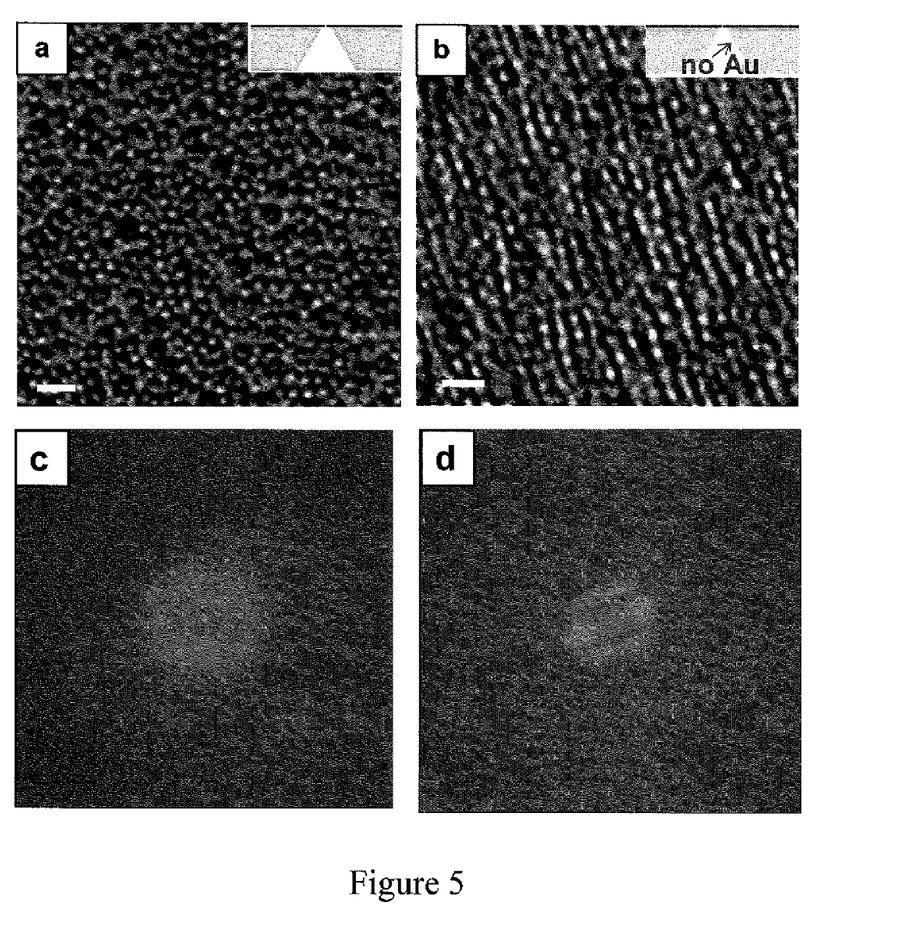
FIG. 5 represents TEM images of a standard TEM specimen of Au nanoparticles obtained by using (a) a phase plate with a Si-based chip substrate wrapped around a thin Au layer (inset); (b) a phase plate with a Si-based chip substrate coated with a surface layer of Au, but no Au coating on the side wall (inset). Scale bar: 20 nm.

With the on-chip phase plate of the present invention in position, the imaging drifting rate and pattern were the same as those observed by the TEM system without the phase plate. However, the image drifting pattern is rather different if the substrate was poorly fabricated, in which the substrate was only coated with a top layer of Au instead of a 3-dimensional Au coating. Using this "incompletely made" phase plate chip, the image drifting rate was found >10 nm/min, and the drifting direction changes randomly—a feature of the charging effect. The TEM images obtained from using the good phase plate chip, and from the bad phase plate chip are shown comparably in FIGS. 5(a) and 5(b), respectively. The FFT images of FIGS. 5(a) and 5(b) are shown in FIGS. 5(c) and 5(d), respectively, which further indicate the good charging releasing effect of a good on-chip thin film phase plate of the present invention.

FIG. 5(a) shows the image of Au particles obtained using the properly made phase plate of the present invention, and the image of the same specimen obtained using a poorly-made phase plate is shown in FIG. 5(b). The practical problem of the charging effect is that it is unexpected and uncontrollable. It is possible that the image is stable for one second, yet distorted in the next. Thus, if the charging resulting from all sources is not properly released, it is unlikely to routinely obtain reliable images. The present invention can properly release charging resulting from all sources, as shown in FIG. 5.

Example 2

Observation of Organic Material

Figure 6:
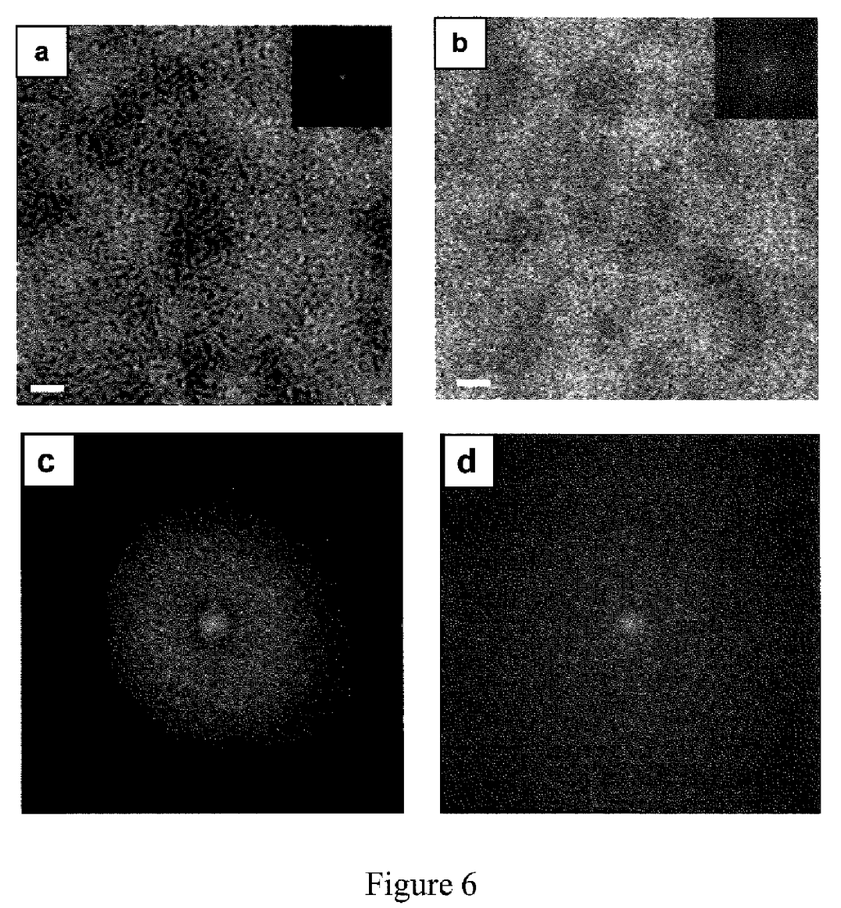
FIG. 6 represents TEM images of a P3HT/PCBM (poly(3-hexylthiophene)/[6,6]-phenyl-C61-butyric acid ethyl ester) film, a photoactive layer of a polymer solar cell device. The images were taken under the condition of (a) in-focus with a phase plate; (b) in-focus without a phase plate. Insets: fast Fourier transforms (FFT) of the corresponding images. Scale bar: 50 nm.

With the on-chip thin film Zernike phase plate of the present invention, many organic devices, including OLED and polymer solar cell specimens, can be observed by TEM. FIG. 6(a) shows an in-focus TEM phase image of a photoactive layer of P3HT/PCBM (1:1) blend, which is taken by using the phase plate of the present invention; and FIG. 6(b) shows an in-focus TEM phase image of the same specimen, which is taken without using the phase plate of the present invention. The TEM specimen used in FIG. 6 has a thickness of ~160 nm, and was prepared in the same way as a polymer layer fabricated in a solar cell device. The photoactive layer retrieved from a bulk heterojunction polymer solar cell device also can be used. In FIGS. 6(a), some spaghetti-like features are found, which are invisible in the in-focus TEM image without using a phase plate (see FIG. 6(b)). It is generally believed that P3HT causes the spaghetti-like phase. Conventionally, the TEM photo of P3HT/PCBM polymer blend is taken after thermal annealing to improve the P3HT crystallization so the spaghetti-like morphology of P3HT can be observed.[22,23] In the present invention, however, the TEM system adopting a present invention is able to identify the P3HT phase in the in-focus TEM image without having the specimen going through thermal annealing. Other polymer solar cell specimens with their in-device thicknesses can also be used in the TEM system of the present invention. The FFT images of FIGS. 6(a) and 6(b) are shown in FIGS. 6(c) and 6(d), respectively, which indicate that the charging releasing effect of the on-chip thin film phase plate of the present invention is good.

FIG. 6 shows that the present invention has the ability to observe these fiber-like (i.e., spaghetti-like) features in such a thick (~160 nm) specimen. In the prior art, nano-morphology of P3HT/PCBM was revealed in TEM specimens with a thickness of 50 nm.[22] However, conventional TEM technique can not clearly image thick polymer solar cell samples with low contrast. With the reliable on-chip phase plate of the present invention, imaging thick polymer specimen has become possible.

Conventionally, increasing the defocus value can improve the image contrast because it results in an increase in the contrast intensity in the low frequency (low k) region. However, using the defocus would also result in a shifting of the "point resolution" to a lower frequency, i.e. the direct interpretable resolution is worsened by using the defocus technique. High defocus value not only significantly decreases the resolution, it will result in artifacts and also makes the interpretation of the image in the frequency range more difficult. Using the on-chip phase plate of the present invention, in-focus image can be achieved reliably, and avoiding the problems resulted from defocus imaging.

Figure 7:
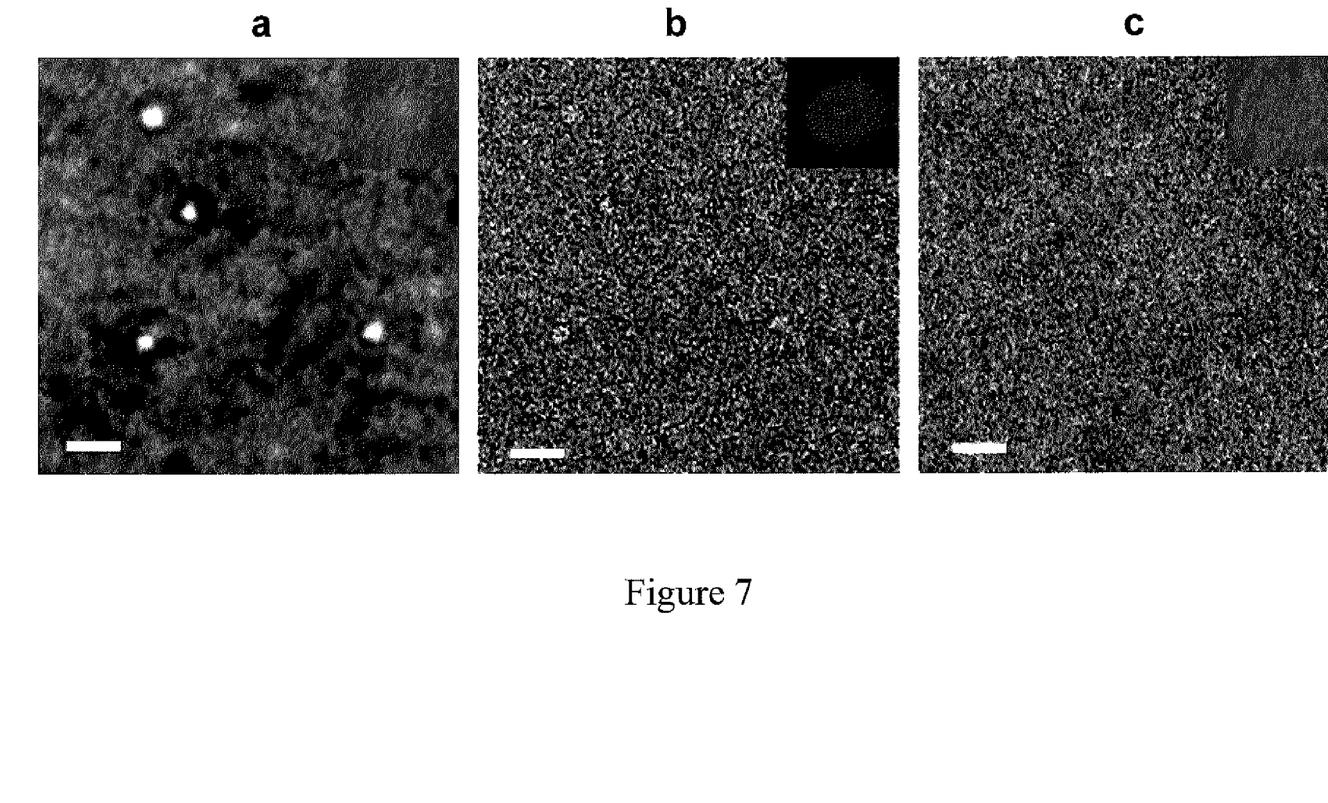
FIG. 7 represents identification of a nanoparticle phase in a P3HT/PCBM specimen. TEM images of a P3HT/PCBM specimen were taken under the condition of (a) in-focus with phase plate; (b) defocus (underfocus ~2 µm) without phase plate, (c) in-focus without phase plate. Insets: Fast Fourier transforms (FFT) of the corresponding images. Scale bar: 20 nm.

In addition, the striking capability of the present invention is demonstrated in FIG. 7, in which an unexpected nano-phase is identified by using the on-chip thin film phase plate. These images shown in FIGS. 7(a)-7(c) were taken in the same position of the same P3HT/PCBM specimen. This nanoparticle-phase (5-8 nm, white dots in FIG. 7(a)) is shown in the in-focus phase image (FIG. 7(a)). Such an ambiguous nano-feature with such a low contrast might be mistaken as contaminations under defocused TEM imaging (FIG. 7(b)), and it is totally invisible in the conventional in-focus image (FIG. 7(c)). Further defocusing would induce more noise and artifacts, as predicted by the contrast transfer function (CTF), and make the studying of the image in such a high magnification impossible. While using the TEM on-chip phase plate of the present invention, these nanoparticles in the organic matrix of P3HT/PCBM are clearly identified in the in-focus TEM image, as shown in FIG. 7(a). The FFT of FIGS. 7(a), 7(b) and 7(c) are shown in FIGS. 7(d), 7(e) and 7(f), respectively, which indicate that the quality of the on-chip thin film phase plate of the present invention is good.

We examined many P3HT/PCBM specimens with various fabrication conditions, and noticed that this nanoparticle-like phase only exists in specimens prepared in 1,2,4-trichlorobenzene (TCB) with a longer drying time. The P3HT/PCBM blend prepared in chloroform ($CHCl_3$), which would be dried much more quickly, did not contain such a nanoparticle phase. The nature of such nanoparticle-like phase is yet to be investigated. However, when an unknown nanostructure of an organic material is examined, the unexpected nano-phases are likely to be overlooked under TEM observation. This is possibly why such a nanoparticle-like phase has never been reported in any P3HT/PCBM study. With our stable TEM on-chip phase plate system, the unexpected nano-phase is observed and verified in P3HT/PCBM polymer solar cell specimens for the first time.

Example 3

Observation of Biological Material

Figure 8:
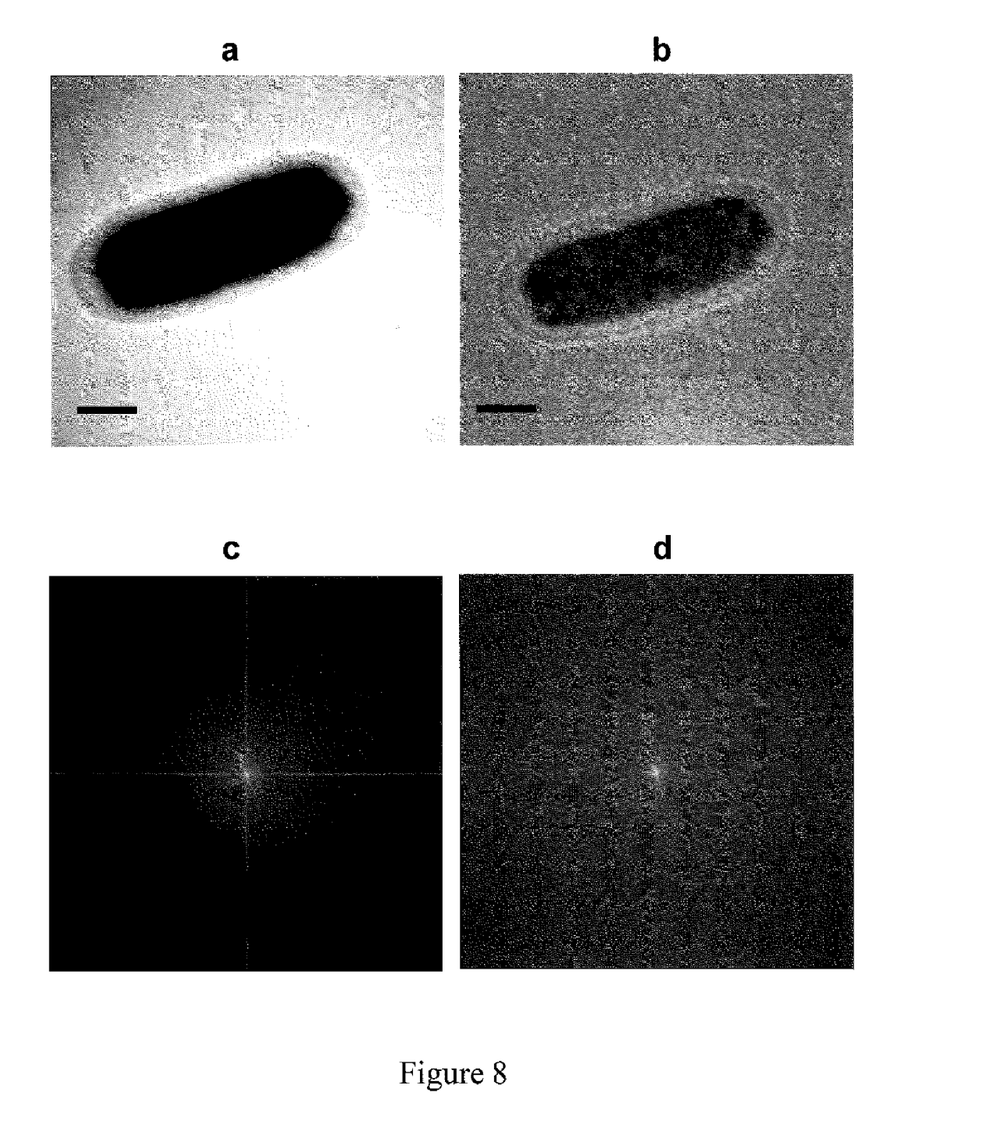
FIG. 8 represents TEM images of an "unstained" E. coli with contrast enhancement. The TEM images were taken under in-focus condition (a) with a phase plate and (b) without a phase plate.

Besides characterizing organic devices, the TEM system of the present invention also has great potential in applications in biological fields. With its stable performance, imaging fine structures of biological samples without going through complicated sample preparation process, such as staining, becomes possible. FIG. 8(a) shows the in-focus TEM image of an unstained *Escherichia coli* (*E. coli*) specimen, which was obtained by using the on-chip phase plate of the present invention. For comparison, the same unstained *E. coli* specimen was observed using the same TEM imaging conditions but without adopting the phase plate of the present invention. The resulting image is shown in FIG. 8(b). The pili surrounding the cell envelope can be clearly seen in the phase image (FIG. 8(a)), but they cannot be identified in FIG. 8(b). The image contrast of the cell envelope itself is also enhanced in the phase image. The FFT images of FIGS. 8(a) and 8(b) are shown in FIGS. 8(c) and 8(d), respectively, which indicate the charging releasing effect of the on-chip thin film phase plate of the present invention is good. To further understand the contrast enhancement achieved by using the phase plate system of the present invention, a color-coding scheme was applied to the *E. coli* images (FIGS. 8(a) & 8(b)) using computer imaging software (Photoshop, Adobe). The same color-coding scheme was applied to FIGS. 8(a) & 8(b), and the resulting color-coded images are shown in FIGS. 8(e) & 8(f), respectively, in which the histograms of the corresponding images are shown in the insets. The 256 grey shades of the original image is coded with two-colors (green and blue), as demonstrated in the x-axis of the histograms (insets in FIGS. 8(e) & 8(f)), where the y-axis of the histograms represents the arbitrary intensity of each color shade in the corresponding image. The *E. coli* image obtained from adopting a phase plate has a bimodal distribution in the histogram, and is reflected in the color-coded image (FIG. 8(e)), in which the pili are shown in blue, and the envelope area is shown in green with some fine structures inside. On the other hand, the image obtained without adopting the phase plate of the present invention does not have a sufficient shading difference, as shown in the inset of FIG. 8(f), to distinguish the fine structures in the image, and the two-colors coding scheme would result in a single color (blue) image (FIG. 8(f). The results indicate that observing biological specimens in unstained condition using our reliable on-chip thin film phase plate system is achievable.

It has been reported that another possible source of charging is contamination of the carbon film during the use of thin film phase plate.[13] However, we did not find such a problem while using the on-chip thin film phase plate of the present invention. The phase plate chip system of the present invention has been routinely operating for months to observe many organic devices as well as some biological specimens, and no noticeable charging effect was observed. the on-chip phase plate of the present invention is indeed effective in releasing charging from all sources. The phase plate chip of the present invention has a low cost, and it can be easily loaded. Thus, it can also serve as a disposable phase plate if used for cryo-EM where contamination is likely to be severe.

The present invention provides an on-chip thin film Zernike phase plate system which allows in-focus TEM images with greatly enhanced contrast without charging problem to be routinely achievable. Reliable in-focus phase imaging is realized by effectively releasing the charging from the phase plate. This on-chip thin film phase plate system can be installed in a commercial TEM system without modifying the TEM optical design, and it is suitable for characterizing organic devices and biological samples. Using this stable system, it is able to identify an unexpected nano-phase in a series of polymer solar cell specimens, and observe fine structures of bio-specimen, such as unstained *E. coli*. The on-chip TEM thin film phase plate system of the present invention thus opens up exciting opportunities for the study of organic materials.

References
1. Vanlaeke, P.; Swinnen, A.; Haeldermans, I.; Vanhoyland, G.; Aernouts, T.; Cheyns, D.; Deibel, C.; D'Haen, J.; Heremans, P.; Poortmans, J. et al. P3HT/PCBM Bulk Heterojunction Solar Cells: Relation Between Morphology and Electro-Optical Characteristics. *Sol. Energy Mater. Sol. Cells* 2006, 90, 2150-2158.
2. Wang, T.; Dunbar, A. D. F.; Staniec, P. A.; Person, A. J.; Hopkinson, P. E.; MacDonald, J. E.; Lilliu, S.; Pizzey, C.; Terrill, N. J.; Donald, A. M. et al. The Development of Nanoscale Morphology in Polymer: Fullerene Photovoltaic Blends During Solvent Casting. *Soft Matter* 2010, 6, 4128-4134.
3. Chang, C.-Y.; Wu, C.-E.; Chen, S.-Y.; Cui, C.; Cheng, Y.-J.; Hsu, C.-S.; Wang, Y.-L.; Li, Y. Enhanced Performance and Stability of A Polymer Solar Cell by Incorporation of Vertically Aligned, Cross-Linked Fullerence Nanorods. *Angew. Chem., Int. Ed.* 2011, 50, 9386-9390.
4. Staniec, P. A.; Parnell, A. J.; Dunbar, A. D. F.; Yi, H.; Pearson; A. J., Wang. T.; Hopinson, P. E.; Kinane, C.; Dalgliesh, R. M.; Donald, A. M. et al. The Nanoscale Morphology of A PCDTBT:PCBM Photovoltaic Blend. *Adv. Energy Mater.* 2011, 1, 499-504.
5. Chu, T.-Y.; Alem, S.; Tsang, S.-W.; Tse, S.-C.; Wakim, S.; Lu, J.; Dennler, G.; Waller, D.; Gaudiana, R.; Tao, Y. Morphology Control in Polycarbazole Based Bulk Heterojunction Solar Cells and Its Impact on Device Performance. *Appl. Phys. Lett* 2011, 98, 253301-253303.
6. Nagayama, K.; Danev, R. Phase-Plate Electron Microscopy: A Novel Imaging Tool To Reveal Close-To-Life Nano-Structures. *Biophys. Rev.* 2009, 1, 37-42.
7. Nagayama, K. Another 60 Years in Electron Microscopy: Development of Phase-Plate Electron Microscopy and Biological Applications. *J. Electron Microsc.* 2011, 60, S43-S62.
8. Unwin, P. N. T. Phase Contrast and Interference Microscopy with The Electron Microscope. *Philos. Trans. R. Soc., B* 1971, 261, 95-104.
9. Parsons, D. F.; Johnson, H. M. Possibility of A Phase Contrast Electron Microscope. *Appl. Opt.* 1972, 11, 2840-2843.
10. Danev, R.; Nagayama, K. Transmission Electron Microscopy with Zernike Phase Plate. *Ultramicroscopy* 2001, 88, 243-252.
11. Barton, B.; Joos, F.; Schroder, R. R. Improved Specimen Reconstruction by Hilbert Phase Contrast Tomography. *J. Struct. Biol.* 2008, 164, 210-220.
12. Barton, B.; Rhinow, D.; Walter, A.; Schroder, R.; Benner, G.; Majorovits, E.; Matijevic, M.; Niebel, H.; Muller, H.; Haider, M. et al. In-Focus Electron Microscopy of Frozen-Hydrated Biological Samples with A Boersch Phase Plate. *Ultramicroscopy* 2011, 111, 1696-1705.
13. Danev, R.; Glaeser, R. M.; Nagayama, K. Practical Factors Affecting The Performance of A Thin-Film Phase Plate for Transmission Electron Microscopy. *Ultramicroscopy* 2009, 109, 312-325.
14. Danev, R.; Nagayama, K. Optimizing The Phase Shift and The Cut-On Periodicity of Phase Plates for TEM. *Ultramicroscopy* 2011, 111, 1305-1315.
15. Buijsse, B.; van Laarhoven, F. M. H. M., Schmid, A. K., Cambie, R. Cabrini, S. Jin, J., Glaeser, R. M. Design of A Hybrid Double-Sideband/Single-Sideband (Schlieren) Objective Aperture Suitable for Electron Microscopy. *Ultramicroscopy* 2011, 111, 1688-1695.
16. Walter, A.; Muzik, H.; Vieker, H.; Turchanin, A.; Beyer, A.; Golzhauser, A.; Lacher, M.; Steltenkamp, S.; Schmitz, S.; Holik, P. et al. Practical Aspects of Boersch Phase Contrast Electron Microscopy of Biological Specimens. *Ultramicroscopy* 2012, 116, 62-72.
17. Fukuda, Y.; Fukazawa, Y.; Danev, R.; Shigemoto, R.; Nagayama, K. Tuning of The Zernike Phase-Plate for Visualization of Detailed Ultrastructure in Complex Biological Specimens. *J. Struct. Biol.* 2009, 168, 476-484.
18. Murata, K.; Liu, X.; Danev, R.; Jakana, J.; Schmid, M. F.; King, J.; Nagayama, K.; Chiu, W. Zernike Phase Contrast Cryo-Electron Microscopy and Tomography for Structure Determination at Nanometer and Subnanometer Resolutions. *Structure* 2010, 18, 903-912.
19. Hayat, M. A. Principles and techniques of electron microscopy: biological applications. *Cambridge University Press*, UK (2000).
20. Danev, R., and Nagayama, K., Transmission electron microscopy with Zernike phase plate. *Ultramicroscopy* 88, 243-252 (2001).
21. Nagayama, K., Development of phase plates for electron microscopes and their biological application. *Eur. Biophys. J* 37, 345-358 (2008).
22. van Bavel, S. S.; Sourty, E.; de With, G.; Loos, J. Three-Dimensional Nanoscale Organization of Bulk Heterojunction Polymer Solar Cells. *Nano Lett.* 2009, 9, 507-513.
23. Agostinelli, T.; Lilliu, S.; Labram, J. G.; Campoy-Quiles, M.; Hampton, M.; Pires, E.; Rawle, J.; Bikondoa, O.; Brandley, D. D. C.; Anthopoulos, T. D. et al. Real-Time Investigation of Crystallization and Phase-Segregation Dynamics in P3HT:PCBM Solar Cells During Thermal Annealing. *Adv. Funct. Mater.* 2011, 21, 1701-1708.

24. Shiue, J.; Hung, S.-K. A TEM Phase Plate Loading System With Loading Monitoring and Nano-positioning Functions. *Ultramicroscopy* 2010, 110, 1238-1242.

We claim:

1. An on-chip thin film Zernike phase plate in the optical path of a transmission electron microscope for releasing charging, comprising:
   a chip substrate having one or more apertures; and
   a thin film layer attached to the top surface of the chip substrate, wherein the thin film layer comprises one or more phase plate holes aligned with the apertures, and the phase plate holes have a diameter smaller than that of the apertures.

2. The on-chip thin film phase plate according to claim 1, wherein the chip substrate is fabricated from a wafer.

3. The on-chip thin film phase plate according to claim 1, wherein the thin film layer is composed of the material selected from carbon (C), beryllium (Be), gold (Au), silver (Ag), silicon (Si), aluminum (Al), or tungsten (W).

4. The on-chip thin film phase plate according to claim 1, wherein the thin film layer has a thickness of 10-100 nm.

5. The on-chip thin film phase plate according to claim 1, wherein the apertures have a diameter of 5-500 μm.

6. The on-chip thin film phase plate according to claim 1, wherein the phase plate holes has a diameter of less than 2 μm.

7. The on-chip thin film phase plate according to claim 1, further comprises a conductive layer coated on surfaces of the chip substrate.

8. The on-chip thin film phase plate according to claim 7, wherein the surfaces of the chip substrate comprise the top surface and the bottom surface of the chip substrate, and the inner wall surfaces of the one or more apertures.

9. The on-chip thin film phase plate according to claim 7, wherein the conductive layer is composed of the material selected from gold (Au), platinum (Pt), copper (Cu), or alloys thereof.

10. The on-chip thin film phase plate according to claim 7, wherein the conductive layer has a thickness of 10-500 nm.

11. A method for observing organic material by a transmission electron microscope, comprising:
   (a) providing an organic material specimen;
   (b) adopting the on-chip thin film phase plate according to claim 1 in a transmission electron microscope; and
   (c) observing the organic material specimen.

12. The method according to claim 11, wherein the on-chip thin film phase plate according to claim 1 is adopted in a transmission electron microscope.

13. The method according to claim 11, wherein the organic material is a polymer.

14. The method according to claim 11, wherein the organic material is a bio-specimen.

15. The method according to claim 14, wherein the bio-specimen is an unstained bio-specimen.

* * * * *